United States Patent [19]

Edfors

[11] Patent Number: 5,050,039

[45] Date of Patent: Sep. 17, 1991

[54] MULTIPLE CIRCUIT CHIP MOUNTING AND COOLING ARRANGEMENT

[75] Inventor: John E. Edfors, Middlesex, Mass.

[73] Assignee: Digital Equipment Corporation, Maynard, Mass.

[21] Appl. No.: 543,411

[22] Filed: Jun. 26, 1990

[51] Int. Cl.[5] .............................................. H05K 7/20
[52] U.S. Cl. ..................................... 361/388; 357/81; 361/398; 361/400
[58] Field of Search ............................. 165/80.3, 185; 174/16.3; 357/80, 81; 361/382, 383, 385, 388, 389, 398, 400

[56] References Cited

U.S. PATENT DOCUMENTS

| | | |
|---|---|---|
| 3,766,439 | 10/1973 | Isaacson . |
| 4,521,829 | 6/1985 | Wessely . |
| 4,535,384 | 8/1985 | Wakabayashi et al. . |
| 4,602,314 | 7/1986 | Broadbent . |
| 4,689,721 | 8/1987 | Damerow et al. . |
| 4,755,866 | 7/1988 | Marshall et al. . |
| 4,774,632 | 9/1988 | Neugebauer . |
| 4,914,551 | 4/1990 | Anschel et al. ...................... 361/386 |

Primary Examiner—Gregory D. Thompson
Attorney, Agent, or Firm—Jones, Tullar & Cooper, P.C.

[57] ABSTRACT

A circuit chip mounting arrangement for use in a multiple chip unit (MCU) of a computer is disclosed which provides high chip packing density to decrease signal path lengths and thereby increase operational frequency. Chip mounting assemblies are employed which include a centrally located metal heat sink block attached to a chip site on the MCU base. A plurality of circuit chips are attached by their top sides to the front and back sides of the heat sink block with a thermally conductive electrically insulating adhesive. The chips are electrically connected to vertically disposed interconnect boards on either side of the heat sink block, and corresponding flex circuits are employed to connect the interconnect boards to bonding pads on the chip site. A pair of the chip assemblies can be disposed on a single chip site of the MCU, and any desired number of circuit chips can be disposed in each chip assembly.

19 Claims, 4 Drawing Sheets

FIG. I

MULTIPLE CIRCUIT CHIP MOUNTING AND COOLING ARRANGEMENT

BACKGROUND OF THE INVENTION

The present invention relates in general to an arrangement for mounting a plurality of circuit chips on a multiple chip unit (MCU), which provides high chip density and efficient cooling and interconnection of the chips.

MCU's are chip mounting structures which contain a plurality of circuit chips, and are often employed to contain the chips in central processors for high performance digital computers. Typically, an MCU includes a multiple layer circuit mounting board which has a plurality of circuit chip mounting sites and associated interconnects and bonding pads for supplying power and control signals to each of the chips. In prior art MCUs, one or more circuit chips are mounted horizontally at each of the chip mounting sites and are connected to bonding pads on the sites by means of conventional TAB lead frames, or the like.

In order to insure that each of the circuit chips of an MCU operates correctly, some means must be provided to remove heat from the chips. In the past, this has been accomplished by providing heat removing structures in the circuit mounting board at each of the chip sites which contact the bottom sides of each of the chips and provide a thermal path for the removal of heat therefrom. These heat removing structures necessarily require space in the chip mounting board which limits the amount of space in the board for the circuit chip interconnects. This places a limitation on the number of circuit chips which can be mounted on an MCU.

As computer technology progresses, the emphasis is on increasing the operational speed or frequency of the computer and a key limitation becomes the time it takes signals to travel from one circuit chip to another. This traverse time is directly proportional to the length of the interconnects between each of the circuit chips and it is thus desirable to mount each of the circuit chips of the computer as physically close to one another as possible to reduce the interconnect lengths. In prior art MCU's, the number of chips is limited by the amount of surface area on the mounting board for each of the circuit chips, as well as by the amount of room available in the board for the heat removing structures and the chip interconnects. Thus, in order to increase the packing density of the circuit chips in an MCU, extra space must be provided not only for the additional circuit chips, but for their interconnects, and a means must be provided to remove the heat generated by the densely packed chips.

SUMMARY OF THE INVENTION

The present invention solves this problem by providing a circuit chip mounting arrangement which permits high density packing of circuit chips on an MCU, short signal paths between each of the circuit chips and heat removal structures which do not interfere with space for the chip interconnects. More particularly, the present invention employs a conventional MCU base assembly including a circuit chip mounting board having at least one chip mounting site on which is mounted a multiple chip assembly. In this assembly, each of a plurality of circuit chips are disposed vertically and have their top sides thermally and mechanically attached to either a front or back side of a centrally disposed metal heat sink block. The circuit chips attached to the front side of the heat sink block are mechanically and electrically connected to a first vertically disposed multiple layer interconnect board, while the circuit chips attached to the back side of the heat sink block are mechanically and electrically connected to a second vertically disposed multiple layer interconnect board. Conventional flex circuits are then employed to connect each of the vertically disposed interconnect boards with bonding pads on the chip site of the MCU chip mounting board.

The circuit chip assembly is sized so that two such assemblies can be mounted on a single chip site on the MCU mounting board. Since all of the circuit chips are vertically oriented relative to the MCU mounting board and the metal heat sink blocks do not interfere with the interconnects contained within the MCU mounting board, this arrangement greatly increases the chip density at each of the chip sites resulting in shorter interconnect distances between each of the circuit chips, and thereby shorter traverse times which increase the potential operating frequency of the circuits. Further, the metal heat sink blocks provide an excellent thermal path by which heat can be dissipated from the circuit chips to the surrounding air or other fluid, the MCU base or a cover attached thereto.

BRIEF DESCRIPTION OF THE DRAWINGS

The features and advantages of the present invention will become apparent from the following detailed description of a preferred embodiment thereof, taken in conjunction with the accompanying drawings in which.

DETAILED DESCRIPTION OF THE PREFERRED EMBODIMENTS

Figure 1:
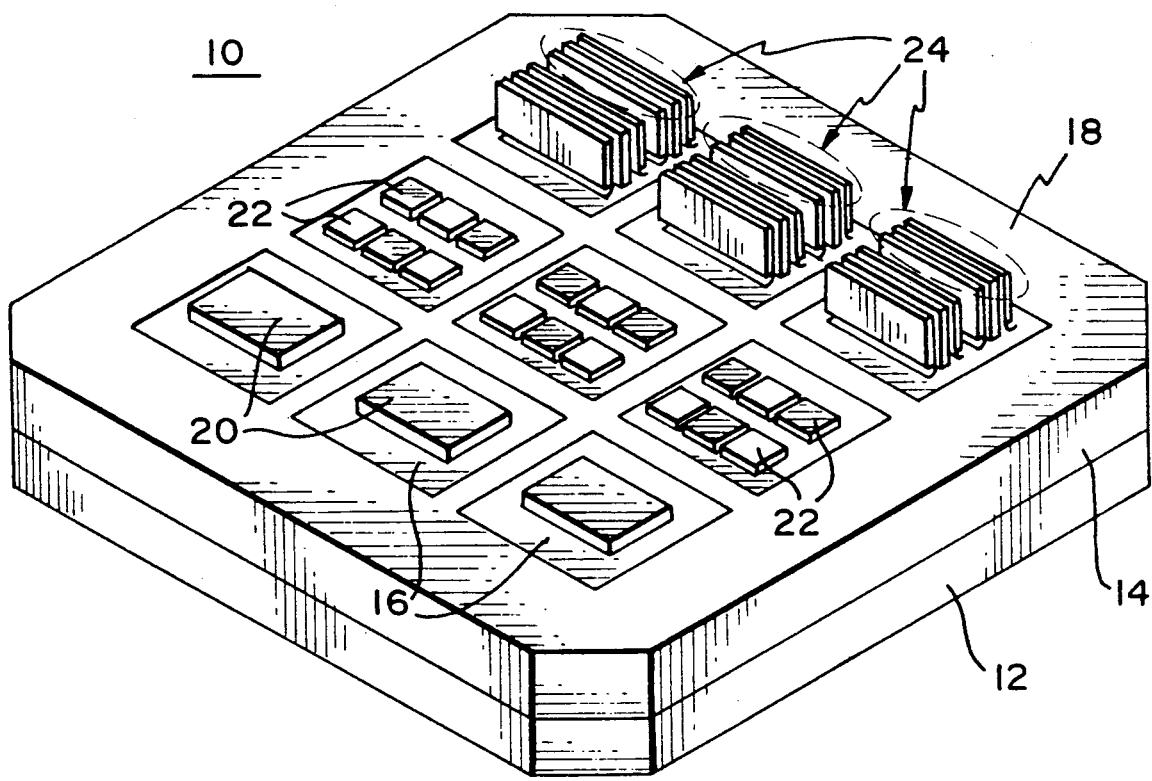
FIG. 1 is a diagrammatic perspective illustration of an MCU base assembly constructed in accordance with a preferred embodiment of the present invention.

Turning now to a more detailed consideration of the present invention, there is illustrated in FIG. 1 an MCU base assembly 10 including a base 12 on which is disposed a multilayer circuit chip mounting board 14 known as a high density signal carrier (HDSC). A plurality of chip sites 16 are formed on a top surface 18 of the HDSC 14 for a reception of various types of electrical component arrangements. In the example illustrated in FIG. 1, a number of large circuit chips 20 are shown mounted in a conventional manner individually on three of the chip sites 16, while three pluralities of smaller chips 22 are shown mounted also in a conventional manner on another three of the chip sites 16. Mounted on each of the remaining chip sites 16, are a plurality of circuit chip assemblies 24 which are constructed in accordance with the present invention and house a plurality of circuit chips in a vertical orientation as illustrated in FIGS. 2 and 3 and discussed below.

Figure 3:
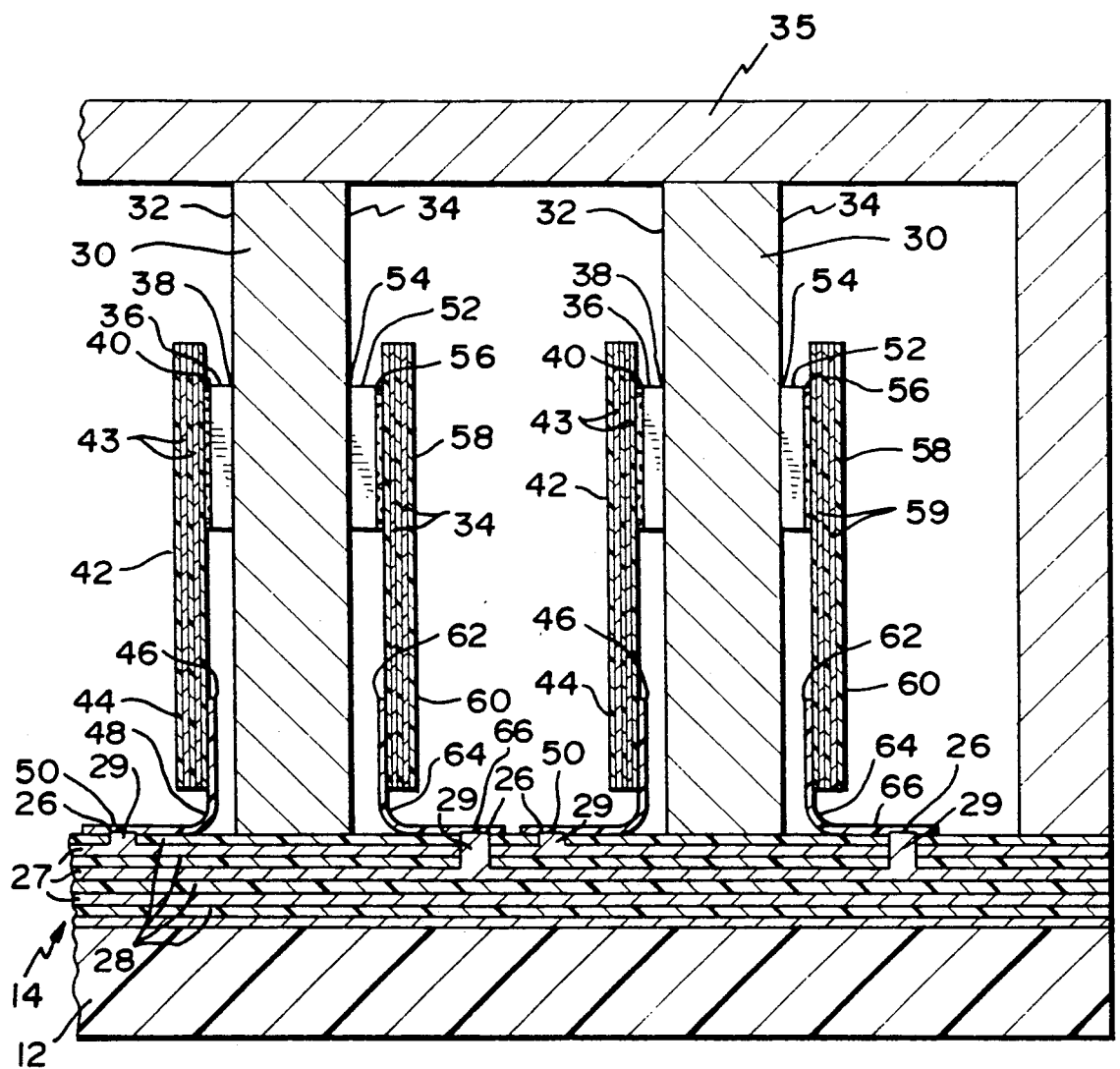
FIG. 3 is a cross sectional front view taken along line 1—1 of FIG. 2.

As best illustrated in FIG. 3, a plurality of bonding pads 26 are disposed on each of the chip sites 16 to supply power and control signals to each of the assemblies 24. In FIG. 3, the HDSC 14 is shown as including a plurality of interconnect layers 27 which are separated by a plurality of dielectric regions 28, and which carry the power and control signals for the circuit chips. Each of the bonding pads 26 is connected to one of the interconnect layers 27 with a vertical via 29.

Figure 2:
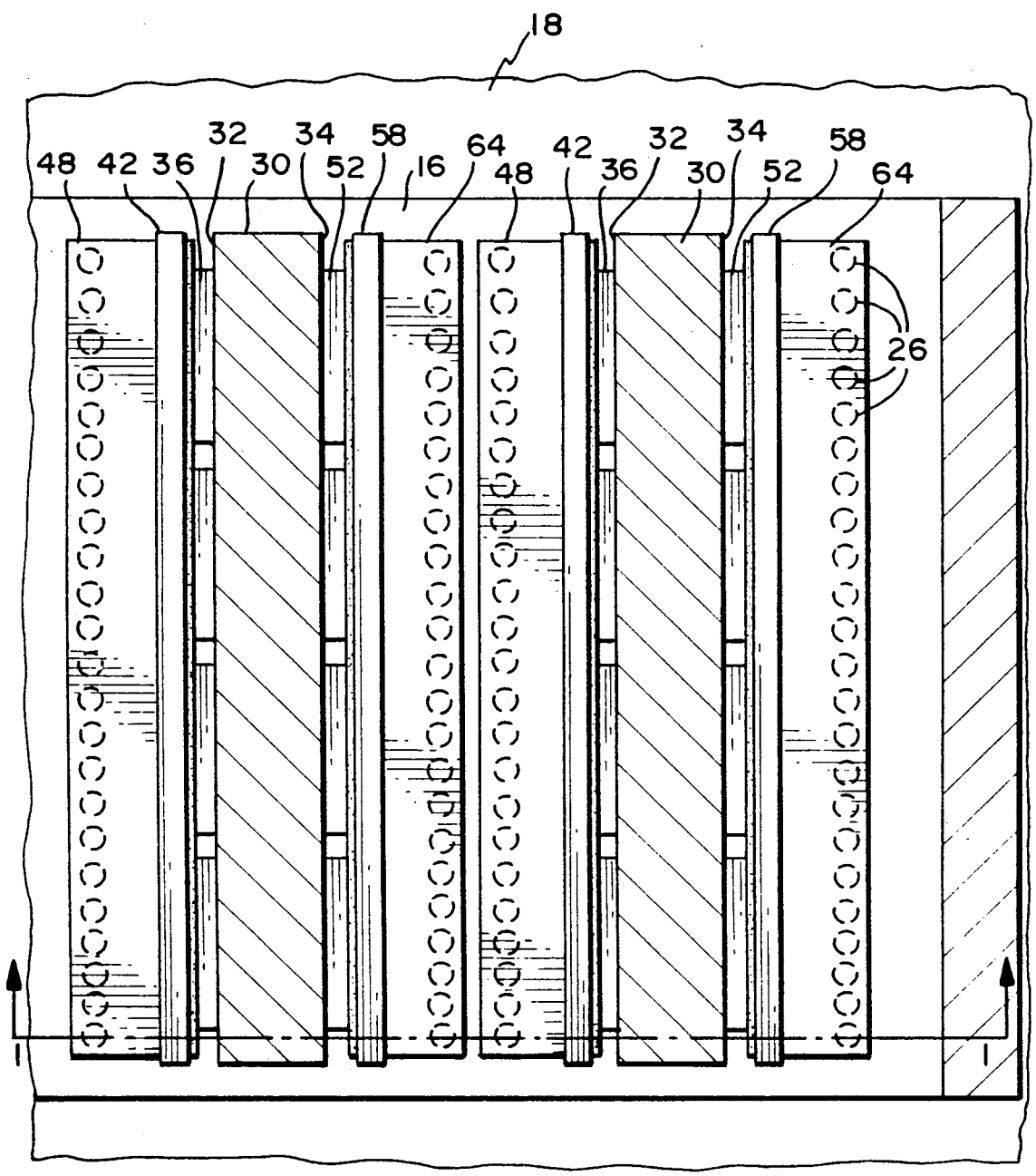
FIG. 2 is a top view of a circuit chip assembly constructed in accordance with a preferred embodiment of the present invention.

As also illustrated in FIGS. 2 and 3 each of the circuit chip mounting assemblies 24 includes a centrally disposed rectangular metal heat sink block 30 having a front vertical side 32 and a back vertical side 34. Each of the heat sink blocks 30 is secured to the top surface 18 of the HDSC 14 at one of the chip sites 16 with any suitable means, such as a thermally conductive adhesive. Heat generated by the circuit chips in the assembly 24 is radiated through the heat sink block 30 to the surrounding air or other fluid, the base 12, or to an MCU cover 35 which contacts the tops of the blocks 30 when in position on the base 12 as illustrated in FIG. 3.

A first plurality of circuit chips 36 each having top sides 38 and bottom connection sides 40 have their top sides 38 thermally and mechanically attached to the front vertical side 32 of the heat sink block 30 with a thermally conductive electrically insulating adhesive, such as diamond filled epoxy. The bottom connection sides 40 of each of the first plurality of circuit chips 36 are electrically and mechanically connected using any conventional technique, such as with pins or solder bumps, to a first vertically disposed multilayer interconnect board 42 having a plurality of interconnect layers 43 formed therein. Each of the first vertically disposed interconnect boards 42 is electrically and mechanically connected at a bottom end 44 thereof to a first connection and 46 of a conventional flex circuit 48, which has a second connection end 50 mechanically and electrically connected to the one of the bonding pads 26 on the chip mounting site 16. The flex circuit 48 and vertically disposed interconnect board 42 serve to carry power and control signals to each of the first plurality of chips 36 from the interconnect layers 27 in the HDSC 14 with the shortest possible signal paths.

A similar circuit chip arrangement is mounted on the back vertical side 34 of the heat sink block 30. In particular, a second plurality of circuit chips 52 have their top sides 54 thermally and mechanically bonded to the back vertical side 34 of the heat sink block 30, and bottom connection sides 56 electrically and mechanically attached to a second vertically disposed interconnect board 58 having a plurality of interconnects 59 formed therein. The second vertically disposed interconnect board 58 has a bottom end 60 electrically and mechanically connected to a first connection end 62 of a second flex circuit 64, which in turn has a second connection end 66 attached to one of the bonding pads 26.

In the arrangement illustrated in FIGS. 2 and 3, each of the circuit chip assemblies 24 includes eight circuit chips so that a total of sixteen circuit chips can be mounted on a single chip site 16. This is in contrast to prior horizontal chip mounting arrangements, such as are illustrated in FIG. 1, in which six similarly sized circuit chips can be mounted on the same sized chip site. Thus, the circuit chip mounting assemblies 24 permit a higher chip packing density, which thereby decreases chip interconnection lengths and signal traverse times for increased operational frequencies. The high packing density of the circuit chips is made possible not only by the vertical orientation of the chips, but also by virtue of the fact that the heat sink blocks 30 are mounted on the surface 18 of the HDSC 14 so that extra space within the board will be available for the additional chip interconnects. Further, since a plurality of circuit chips are served by each of the flex circuits 48 and 64, a number of interconnect lines can be saved by using some of the interconnect lines to serve more than one circuit chip where possible. The symmetrical arrangement of the circuit chips in each of the assemblies 24 also helps avoid interconnection length variances among the chips which can cause phase problems that also limit the operating speed.

Figure 4:
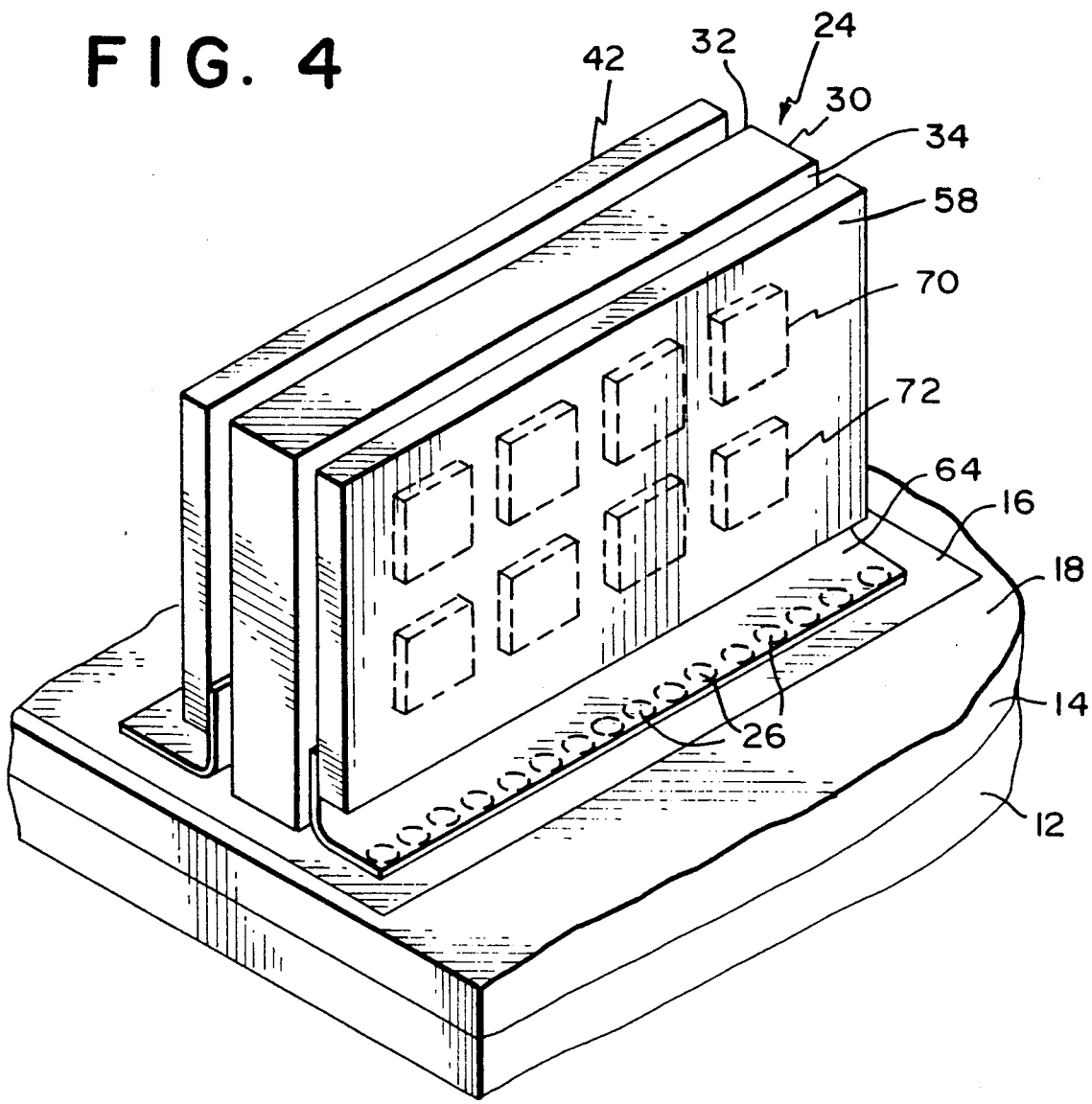
FIG. 4 is a diagrammatic perspective illustration of a circuit chip assembly constructed in accordance with another preferred embodiment of the present invention and mounted on a chip site of an MCU.

It is also possible, as illustrated in FIG. 4, to include even more circuit chips in one of the circuit chip assemblies by using vertical stacking techniques. More particularly, FIG. 4 illustrates a circuit chip assembly 24 which is similar to those shown in FIGS. 2 and 3 but which has been modified so that first and second rows 70 and 72 of four circuit chips are disposed on each vertical side 32 and 34 of the metal heat sink block 30. In this embodiment, sixteen circuit chips are disposed in each of the chip assemblies 24 so that a total of thirty-two circuit chips are located on each chip site 16 which increases the chip packing density even further.

The present invention therefore provides a circuit chip mounting and cooling arrangement in which a large number of circuit chips can be mounted symmetrically on a single chip site with short interconnect lengths which reduce signal traverse times and thereby increase the operational speed of the circuits. The short interconnect lengths are a result of high chip packing density which is permitted by the vertical chip mounting configuration and the use of the surface mounted heat sink blocks which allow more space in the chip mounting board for additional interconnects.

Although the invention has been disclosed in terms of preferred embodiments, it will be understood that numerous modifications and variations could be made thereto without departing from the true spirit and scope of the invention as set forth in the following claims.

I claim:

1. A circuit chip mounting comprising:
   a horizontally disposed circuit chip mounting board having a plurality of electrical interconnects formed therein for carrying power and control signals to a plurality of circuit chips, and including at least a first multiple circuit chip mounting site and a first plurality of bonding pads on said chip mounting site electrically connected to said interconnects; and,
   at least a first circuit chip assembly mounted at a first location on said first chip mounting site, said assembly including:
   a) a heat sink having front and back vertical sides;
   b) a first and a second plurality of circuit chips, each having top sides and bottom connection sides, said first plurality of circuit chips being thermally and mechanically attached by their top sides to said front side of said heat sink and said second plurality of circuit chips being thermally and mechanically attached by their top sides to said back side of said heat sink;
   c) first and second vertically disposed interconnect boards, said first interconnect board being mechanically and electrically connected to the bottom connection sides of said first plurality of circuit chips and said second interconnect board being mechanically and electrically connected to the bottom connection sides of said second plurality of circuit chips; and d) means to electrically connect said first and second vertically disposed interconnect boards to said bonding pads on said chip mounting site of said horizontally disposed circuit chip mounting board.

2. The circuit chip mounting of claim 1, wherein said means in said assembly to electrically connect comprises:
first and second flex circuits each having first and second electrical connection ends, said first end of said first flex circuit being mechanically and electrically connected to said first vertically disposed interconnect board, and said first end of said second flex circuit being mechanically and electrically connected to said second vertically disposed interconnect board; and, said second ends of said first and second flex circuits being electrically connected to said bonding pads on said chip site of said horizontally disposed circuit chip site mounting board.

3. The circuit chip mounting of claim 1, further including a second circuit chip assembly substantially similar to said first circuit chip assembly mounted at a second location on said first chip mounting site.

4. The circuit chip mounting of claim 1, further including at least a second multiple circuit chip mounting site on said horizontally disposed circuit chip mounting board, and a second plurality of bonding pads on said second chip mounting site connected to said interconnects.

5. The circuit chip mounting of claim 4, further including at least a second circuit chip assembly substantially similar to said first circuit chip assembly mounted on said second chip mounting site.

6. The circuit chip mounting of claim 4, further including a circuit chip mounted at a first location on said second chip mounting site and electrically connected to said second plurality of bonding pads in said horizontally disposed circuit chip mounting board.

7. The circuit chip mounting of claim 1, wherein said first and second vertically disposed interconnect boards are high density multiple layer interconnect boards.

8. The circuit chip mounting of claim 1 wherein said heat sink is a metal block.

9. The circuit chip mounting of claim 1 further including a cover member disposed on said chip mounting board and contacting said heat sink.

10. A circuit chip mounting comprising:
a horizontally disposed circuit chip mounting board having a plurality of electrical interconnects formed therein for carrying power and control signals to a plurality of circuit chips, and including at least a first multiple circuit chip mounting site and, a plurality of bonding pads on said chip mounting site electrically connected to said interconnects; and,
a first and a second circuit chip assembly mounted at a first and a second location, respectively, on said first chip mounting site, each said assembly including:
a) a metal block heat sink having front and back vertical sides;
b) a first and a second plurality of circuit chips, each having top sides and bottom connection sides, said first plurality of circuit chips being thermally and mechanically attached by their top sides to said front side of said heat sink and said second plurality of circuit chips being thermally and mechanically attached by their top side to said back side of said heat sink;
c) first and second vertically disposed interconnect boards, said first interconnect board being mechanically and electrically connected to the bottom connection sides of said first plurality of circuit chips and said second interconnect board being mechanically and electrically connected to the bottom connection side of said second plurality of circuit chips; and
d) first and second flex circuits each having first and second electrical connection ends, said first end of said first flex circuit being mechanically and electrically connected to said first vertically disposed interconnect board, and said first end of said second flex circuit being mechanically and electrically connected to said second vertically disposed interconnect board; and, said second ends of said first and second flex circuits being electrically connected to said bonding pads in said horizontally disposed circuit chip mounting board.

11. A circuit chip mounting comprising:
a circuit chip mounting board having a plurality of electrical interconnects formed therein for carrying power and control signals to a plurality of circuit chips, and including at least a first multiple circuit chip mounting site and a first plurality of bonding pads on said chip mounting site electrically connected to said interconnects; and,
at least a first circuit chip assembly mounted at a first location on said first chip mounting site, said assembly including:
a) a heat sink having at least first and second sides;
b) at least a first and a second circuit chip, each having a top side and a bottom connection side, said first circuit chip being thermally and mechanically attached by its top side to said first side of said heat sink and said second circuit chip being thermally and mechanically attached by its top side to said second side of said heat sink;
c) first and second interconnect boards, said first interconnect boards being mechanically and electrically connected to the bottom connection side of said first circuit chip and said second interconnect board being mechanically and electrically connected to the bottom connection side of said second circuit chip; and
d) means to electrically connect said first and second interconnect boards to said bonding pads on said chip mounting site of said circuit chip mounting board.

12. The circuit chip mounting of claim 11, wherein said means in said assembly to electrically connect comprises:
first and second flex circuits each having first and second electrical connection ends, said first end of said first flex circuit being mechanically and electrically connected to said first interconnect board, and said first end of said second flex circuit being mechanically and electrically connected to said second interconnect board; and, said second ends of said first and second flex circuits being electrically connected to said bonding pads on said chip mounting site of said circuit chip mounting board.

13. The circuit chip mounting of claim 11, further including a second circuit chip assembly substantially similar to said first circuit chip assembly mounted at a second location on said first chip mounting site.

14. The circuit chip mounting of claim 11, further including at least a second multiple circuit chip mounting site on said circuit chip mounting board, and a second plurality of bonding pads on said second chip mounting site connected to said interconnects.

15. The circuit chip mounting of claim 14, further including at least a second circuit chip assembly substantially similar to said first circuit chip assembly mounted at a second location on said second chip mounting site.

16. The circuit chip mounting of claim 14, further including a circuit chip mounted at a first location on said second chip mounting site and electrically connected to said second plurality of bonding pads in said circuit chip mounting board.

17. The circuit chip mounting of claim 11, wherein said first and second interconnect boards are high density multiple layer interconnect boards.

18. The circuit chip mounting of claim 11 wherein said heat sink is a metal block.

19. The circuit chip mounting of claim 11 further including a cover member disposed on said chip mounting board and contacting said heat sink.

* * * * *